(12) United States Patent
Gan et al.

(10) Patent No.: US 8,609,495 B2
(45) Date of Patent: Dec. 17, 2013

(54) HYBRID GATE PROCESS FOR FABRICATING FINFET DEVICE

(75) Inventors: Tian-Choy Gan, Zhubei (TW); Hsien-Chin Lin, Hsinchu (TW); Chia-Pin Lin, Xinpu Township, Hsinchu County (TW); Shyue-Shyh Lin, Hsinchu (TW); Li-Shiun Chen, Hsinchu (TW); Shin Hsien Liao, Minsyong Township, Chiayi County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 534 days.

(21) Appl. No.: 12/756,662

(22) Filed: Apr. 8, 2010

(65) Prior Publication Data

US 2011/0248348 A1 Oct. 13, 2011

(51) Int. Cl.
*H01L 27/092* (2006.01)
*H01L 21/8238* (2006.01)

(52) U.S. Cl.
USPC ........... 438/275; 438/197; 257/204; 257/369; 257/E27.064

(58) Field of Classification Search
USPC ........... 257/369; 438/216, 142, 197, 199, 275
See application file for complete search history.

(56) References Cited

U.S. PATENT DOCUMENTS

| | | | |
|---|---|---|---|
| 6,706,571 B1 | 3/2004 | Yu et al. | |
| 6,764,884 B1 * | 7/2004 | Yu et al. | 438/157 |
| 6,858,478 B2 | 2/2005 | Chau et al. | |
| 6,929,992 B1 * | 8/2005 | Djomehri et al. | 438/199 |
| 6,943,407 B2 * | 9/2005 | Ouyang et al. | 257/329 |
| 7,190,050 B2 | 3/2007 | King et al. | |
| 7,195,969 B2 * | 3/2007 | Chan et al. | 438/230 |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,858,462 B2 * | 12/2010 | Hase | 438/199 |
| 8,084,824 B2 * | 12/2011 | Yu et al. | 257/369 |
| 8,153,498 B2 * | 4/2012 | Hsu et al. | 438/382 |
| 8,354,313 B2 * | 1/2013 | Kwon et al. | 438/199 |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Matthew W Such
*Assistant Examiner* — William Harriston
(74) *Attorney, Agent, or Firm* — Haynes and Boone, LLP

(57) ABSTRACT

Provided is a method of fabricating a semiconductor device that includes forming first and second fins over first and second regions of a substrate, forming first and second gate structures over the first and second fins, the first and second gate structures including first and second poly gates, forming an inter-level dielectric (ILD) over the substrate, performing a chemical mechanical polishing on the ILD to expose the first and second poly gates, forming a mask to protect the first poly gate of the first gate structure, removing the second poly gate thereby forming a first trench, removing the mask, partially removing the first poly gate thereby forming a second trench, forming a work function metal layer partially filling the first and second trenches, forming a fill metal layer filling a remainder of the first and second trenches, and removing the metal layers outside the first and second trenches.

20 Claims, 18 Drawing Sheets

(56) References Cited

U.S. PATENT DOCUMENTS

| | | | |
|---|---|---|---|
| 2004/0099885 A1* | 5/2004 | Yeo et al. ................. 257/208 |
| 2005/0153490 A1 | 7/2005 | Yoon et al. |
| 2006/0263961 A1* | 11/2006 | Kittl et al. ................. 438/199 |
| 2006/0286755 A1* | 12/2006 | Brask et al. ................. 438/299 |
| 2007/0037343 A1* | 2/2007 | Colombo et al. ............ 438/231 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0155142 A1* | 7/2007 | Jin et al. ................. 438/514 |
| 2007/0197042 A1* | 8/2007 | Brask ................. 438/753 |
| 2007/0228372 A1 | 10/2007 | Yang et al. |
| 2008/0102634 A1* | 5/2008 | Pas et al. ................. 438/692 |
| 2008/0142841 A1* | 6/2008 | Lindert et al. ............ 257/190 |
| 2008/0197424 A1* | 8/2008 | Haensch et al. ............ 257/407 |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2009/0258482 A1* | 10/2009 | Lin et al. ................. 438/585 |
| 2009/0275179 A1* | 11/2009 | Basker et al. ............ 438/231 |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0087055 A1* | 4/2010 | Lai et al. ................. 438/585 |
| 2010/0183961 A1 | 7/2010 | Shieh et al. |
| 2010/0203734 A1 | 8/2010 | Shieh et al. |
| 2010/0264468 A1 | 10/2010 | Xu |
| 2011/0057267 A1* | 3/2011 | Chuang et al. ............ 257/380 |
| 2011/0070712 A1* | 3/2011 | Johnson et al. ............ 438/382 |
| 2011/0079856 A1* | 4/2011 | Tsai et al. ................. 257/369 |
| 2011/0108894 A1* | 5/2011 | Sung et al. ................. 257/288 |
| 2011/0147810 A1* | 6/2011 | Hsu et al. ................. 257/288 |
| 2011/0171820 A1* | 7/2011 | Tsau et al. ................. 438/592 |
| 2011/0201164 A1* | 8/2011 | Chung et al. ............ 438/229 |
| 2011/0237046 A1* | 9/2011 | Maszara et al. ............ 438/424 |
| 2012/0032240 A1* | 2/2012 | Mayuzumi ................. 257/288 |
| 2013/0069111 A1* | 3/2013 | Flachowsky et al. ......... 257/192 |

OTHER PUBLICATIONS

Hsien-Hsin Lin, et al., U.S. Appl. No. 12/703,918, "Method for Fabricating a Finfet Device," filed Feb. 11, 2010, 40 pages.
Chien-Chang Su, et al., U.S. Appl. No. 12/644,869, "Method for Incorporating Impurity Element in EPI Silicon Process," filed Dec. 22, 2009, 21 pages.
Tsung-Lin Lee, et al., U.S. Appl. No. 12/622,038, "Sacrificial Offset Protection Film for a Finfet Device," filed Nov. 19, 2009, 56 pages.
Jeff J. Xu, et al., U.S. Appl. No. 12/784,207, "Method of Forming EPI Film in Substrate Trench," filed May 20, 2010, 33 pages.
Ming-Lung Cheng, et al. U.S. Appl. No. 12/780,124, "Method and Apparatus for Enhancing Channel Strain," filed May 14, 2010, 35 pages.
Jhon Jhy Liaw, U.S. Appl. No. 12/823,907, "Cell Structure for Dual-Port SRAM," filed Jun. 25, 2010, 46 pages.
Jhon Jhy Liaw, U.S. Appl. No. 12/827,406, "Rom Cell Circuit for Finfet Devices," filed Jun. 30, 2010, 32 pages.
Jhon Jhy Liaw, U.S. Appl. No. 12/823,860, "Structure and Method for SRAM Cell Circuit," filed Jun. 25, 2010, 37 pages.
Jhon Jhy Liaw, et al., U.S. Appl. No. 12/827,690, "Layout for Multiple-Fin SRAM Cell," filed Jun. 30, 2010, 35 pages.
Jeng-Jung Shen, et al., U.S. Appl. No. 12,780,060, "Automatic Layout Conversion for Finfet Device," filed May 14, 2010, 29 pages.
Jeng-Jung Shen, et al., U.S. Appl. No. 12/780,426, "Finfet Boundary Optimization," filed May 14, 2010, 28 pages.
Yu-Lien Huang, et al., U.S. Appl. No. 12/840,830, "High Surface Dopant Concentration Semiconductor Device and Method of Fabricating," filed Jul. 21, 2010, 21 pages.
Peng-Soon Lim, et al., U.S. Appl. No. 12/827,512, "Gate Structures and Method of Fabricating Same," filed Jun. 30, 2010, 41 pages.
Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.
Clement Hsingjen Wann, et al., U.S. Appl. No. 12/834,617, "In-Situ Spectrometry," filed Jul. 12, 2010, 20 pages.
Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.
Jeff J. Xu, et al, U.S. Appl. No. 12/906,820, "Fin-Like Field Effect Transistor (Finfet) Device and Method of Manufacturing Same," filed Oct. 18, 2010, 55 pages.
Jeff J. Csu, et al, U.S. Appl. No. 12/917,902, "Fin-Like Field Effect Transistor (Finfet) Device and Method of Manufacturing Same," filed Nov. 2, 2010, 61 pages.
Mark van Dal, U.S. Appl. No. 12/900,895, "Method of Fabricating a Semiconductor Device Having an Epitaxly Region," filed Oct. 8, 2010, 21 pages.
Hsin-Chih Chen, et al, U.S. Appl. No. 12/907,272, "Multi-Fin Device by Self-Aligned Castle Fin Formation," filed Oct. 19, 2010, 34 pages.
Chien-Hsun Wang, et al, U.S. Appl. No. 12/952,376, "Method for Adjusting Fin Width in Integrated Circuitry," filed Nov. 23, 2010, 27 pages.
Chien-Shun Wang, et al, U.S. Appl. No. 12/949,881, "Method for Forming Metrology Structures From Fins in Integrated Circuitry," filed Nov. 19, 2010, 16 pages.
Chien-Hsun Wang, et al, U.S. Appl. No. 12/953,148, "Device and Method for Forming Fins in Integrated Circuitry," filed Nov. 23, 2010, 39 pages.

\* cited by examiner

… (1)

HYBRID GATE PROCESS FOR FABRICATING FINFET DEVICE

BACKGROUND

The present disclosure relates generally to the field of fabrication of semiconductor devices, and more specifically to a method of fabricating a fin type field effect transistor (FinFET) or portion thereof.

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin 'fin' extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Further advantages of FinFETs include reducing the short channel effect and higher current flow.

Additionally, various materials have been implemented for the gate electrode and gate dielectric in CMOS technology. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. A gate last (or gate replacement) approach has been implemented to address concerns of high temperature processing on metal materials.

Therefore, what is desired is a method of fabricating FinFET devices in a gate last process.

SUMMARY

One of the broader forms of an embodiment of the present invention involves a method of fabricating a semiconductor device. The method includes forming first and second fin structures over first and second regions of a substrate, respectively; forming first and second gate structures over the first and second fin structures, respectively, the first and second gate structures including first and second polysilicon (poly) gates, respectively; forming an inter-level dielectric (ILD) over the substrate; performing a chemical mechanical polishing (CMP) on the ILD to expose the first and second poly gates; forming a mask to protect the first poly gate of the first gate structure; removing the second poly gate of the second gate structure thereby forming a first trench; removing the mask; partially removing the first poly gate of the first gate structure thereby forming a second trench; forming a work function metal layer partially filling the first and second trenches; forming a fill metal layer filling a remainder of the first and second trenches; and removing the metal layers outside the first and second trenches.

Another one of the broader forms of an embodiment of the present invention involves a method of fabricating a semiconductor device. The method includes forming first and second fin structures over first and second regions of a substrate, respectively; forming first and second gate structures over the first and second fin structures, respectively, the first and second gate structures including first and second polysilicon (poly) gates, respectively; forming an inter-level dielectric (ILD) over the substrate; performing a chemical mechanical polishing (CMP) on the ILD to expose the first and second poly gates; partially removing the first and second poly gates of the first and second gate structures, respectively, thereby forming first and second trenches in the first and second gate structures, respectively; forming a mask to protect a remaining portion of the first poly gate of the first gate structure; removing a remaining portion of the second poly gate from the second gate structure thereby extending the second trench; removing the mask; forming a work function metal layer partially filling the first and second trenches; forming a fill metal layer filling a remainder of the first and second trenches; and removing the metal layers outside the first and second trenches.

Yet another one of the broader forms of an embodiment of the present invention involves a semiconductor device. The semiconductor device includes a substrate having first and second regions; first and second fin structures disposed in the first and second regions of the substrate, respectively; and first and second gate structure disposed over the first and second fin structures respectively. The first gate structure includes: a first high-k dielectric layer; a doped polysilicon (poly) layer disposed over the high-k dielectric layer; a first work function layer disposed over the doped poly layer; and a first fill metal layer disposed over the first work function layer. The second gate structure includes: a second high-k dielectric layer; a second work function layer disposed over the second high-k dielectric layer, the second work function layer being formed of a same material as the first work function layer; and a second fill metal layer disposed over the second work function layer, the second fill metal layer being formed of a same material as the first fill metal layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a FinFET device and method of fabricating a FinFET device or portion of a device. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
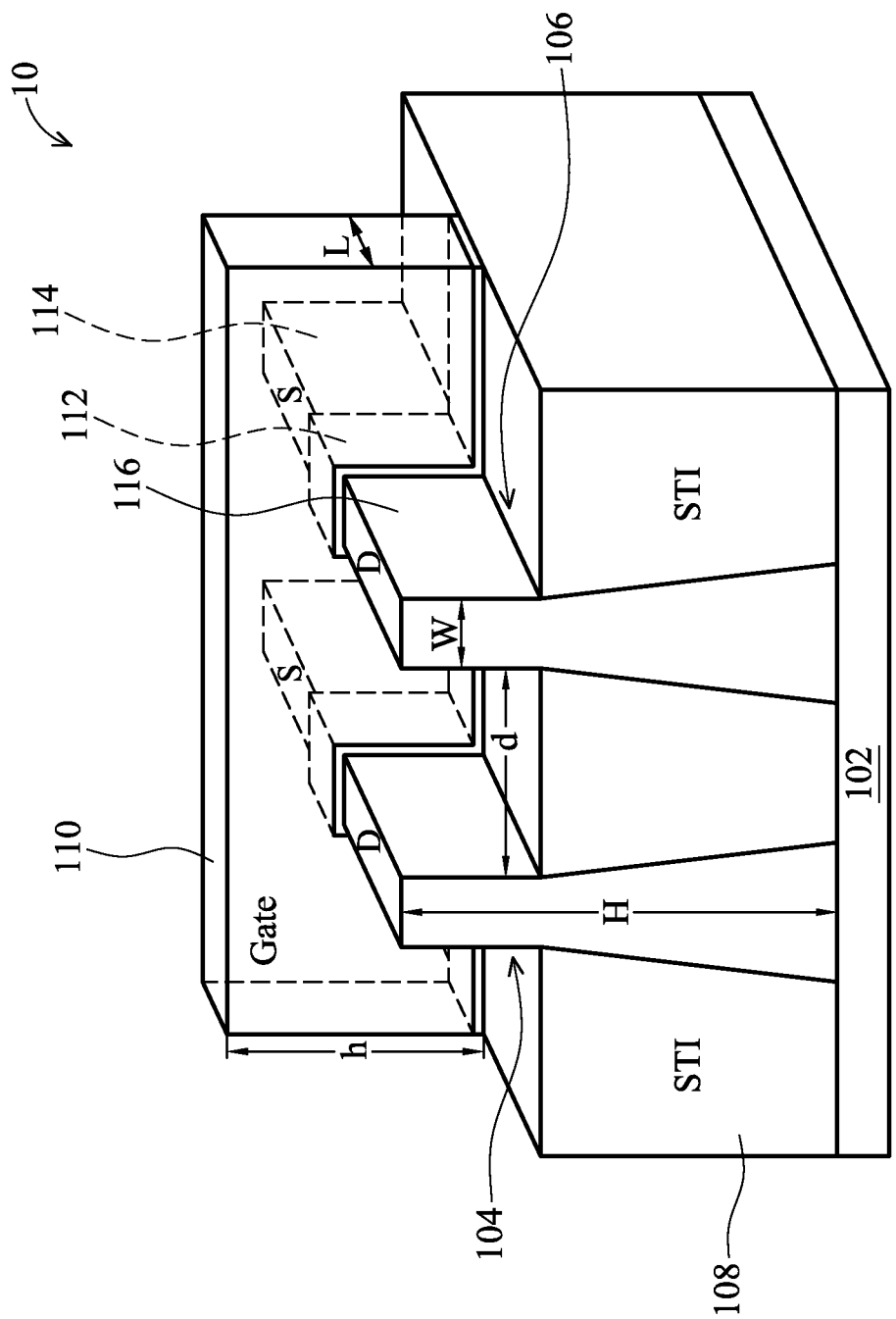
FIG. 1 is a perspective view of an embodiment of a fin-like field effect transistor (FinFET) device according to various aspects of the present disclosure.

Referring to FIG. 1, illustrated is a perspective view of an embodiment of a FinFET device 100 according various aspects of the present disclosure. The FinFET device 100 includes a substrate 102. In an embodiment, the substrate 102 includes a bulk silicon substrate. The substrate 102 may be silicon in a crystalline structure. In other embodiments, the substrate 102 may include other elementary semiconductors such as germanium, or include a compound semiconductor such as, silicon carbide, gallium arsenide, indium arsenide, and indium phosphide. In some other embodiments, the substrate 102 includes a silicon-on-insulator (SOI) substrate. The SOI substrate may be fabricated using separation by implantation of oxygen (SIMOX), wafer bonding, and/or other suitable methods.

The FinFET device 100 further includes fin structures 104, 106 (e.g., Si fins) that extend from the substrate 102. In other embodiments, the fin structures 104, 106 may optionally include germanium. The fin structures 104, 106 may be fabricated by using suitable processes such as photolithography and etch. In an embodiment, the fin structures 104, 106 are etched from the substrate 102 using dry etch or plasma processes. Shallow trench isolation (STI) structures 108 surround the fins 104, 106. The STI structures 108 may include any suitable insulating material. The fin structures 104, 106 may have a width (W) ranging from about 1 nm to about 100 nm. The fin structures 104, 106 may be spaced a distance (d) ranging from 1 nm to about 1000 nm apart. The fin structures 104, 106 may have a height (H) ranging from about 1 nm to about 100 nm. It is understood that although two fin structures are illustrated additional parallel fins may be formed in a similar manner.

The FinFET device 100 further includes a gate structure 110. The gate structure 110 is formed on a central portion of the fin structures 104, 106. In some embodiments, multiple gate structures are formed over the fin structures. The gate structure 110 may have a length (L) ranging from about 1 nm to about 100 nm for advanced technology process nodes. The length (L) of the gate structure 110 is measured in a direction perpendicular the width (W) of the fin structures 104, 106. The gate structure 110 may have a height (h) ranging from about 100 angstrom (Å) to about 5000 angstrom (Å) after a chemical mechanical polishing (CMP). The gate structure 110 includes a gate dielectric layer and a gate electrode. It is understood that numerous other layers may also be present, for example, capping layers, interface layers, spacer elements, and/or other suitable features. In an embodiment, the gate dielectric layer may include an interfacial layer such as silicon oxide. The gate dielectric layer may further include other dielectric materials such as, silicon nitride, silicon oxinitride, dielectric with a high dielectric constant (high-k), and/or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide and/or combinations thereof. The gate electrode may include polysilicon and/or a metal including metal compounds such as, TiN, TaN, NiSi, CoSi, Mo, Cu, W, Al, Co, and/or other suitable conductive materials. The gate electrode may be formed in a gate last process (or gate replacement process) as will be explained below.

The fin structures 104, 106 include a channel region 112 surrounded by the gate structure 110. The fin structures 104, 106 may be doped to provide a suitable channel for an N-type FinFET (NMOS device) or P-type FinFET (PMOS device). The fin structures 104, 106 may be doped using processes such as, ion implantation, diffusion, annealing, and/or other suitable processes. The fin structures 104, 106 include a source region 114 and drain region 116 associated with the FinFET device 100. The source region 114 and drain region 116 may include an epitaxial (epi) silicon (Si) or epi silicon carbide (SiC) for an NMOS device, and epi silicon germanium (SiGe) or epi germanium (Ge) for a PMOS device. The FinFET device 100 may be a device included in a microprocessor, memory cell (e.g., SRAM), and/or other integrated circuits.

Figure 2:
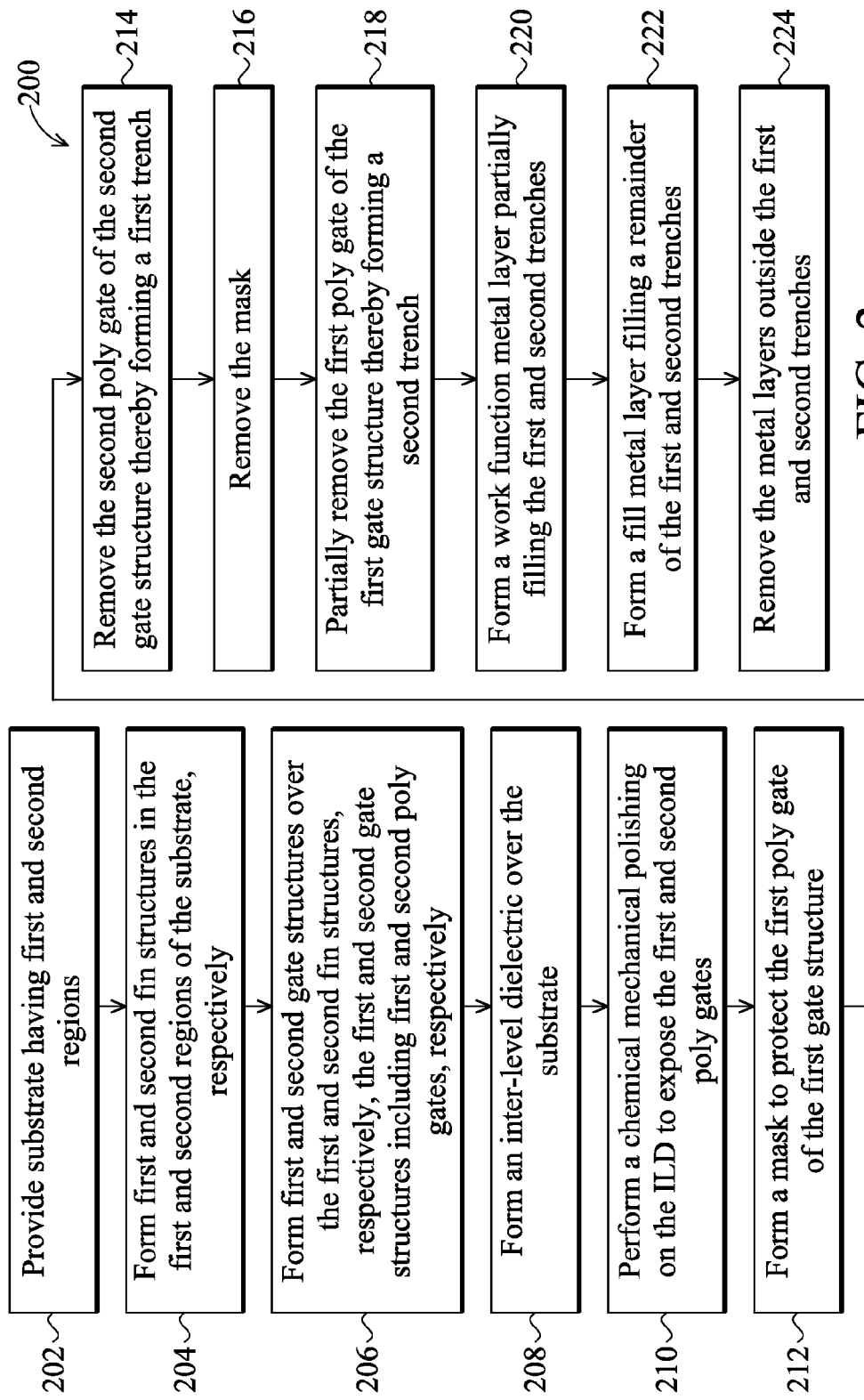
FIG. 2 is a flowchart of a method of fabricating a semiconductor device according to various aspects of the present disclosure.

Referring to FIG. 2, illustrated is an embodiment of a method 200 of fabricating a semiconductor device according to various aspects of the present disclosure. The method 200 begins with block 202 in which a substrate having first and second regions is provided. The method 200 continues with block 204 in which first and second fin structures are formed in the first and second regions of the substrate, respectively. The method 200 continues with block 206 in which first and second gate structures are formed over the first and second fin structures, respectively. The first and second gate structures include first and second polysilicon (poly) gates, respectively. The method 200 continues with block 208 in which an inter-level dielectric (ILD) is formed over the substrate. The method 200 continues with block 210 in which a chemical mechanical polishing (CMP) is performed on the ILD to expose the first and second poly gates. The method 200 continues with block 212 in which a mask is formed to protect the first poly gate of the first gate structure.

The method 200 continues with block 214 in which the second poly gate of the second gate structure is removed thereby forming a first trench. The method 200 continues with block 216 in which the mask is removed. The method 200 continues with block 218 in which the first poly gate of the first gate structure is partially removed thereby forming a second trench. The method 200 continues with block 220 in which a work function metal layer is formed partially filling the first and second trenches. The method 200 continues with block 222 in which a fill metal layer is formed filling a remainder of the first and second trenches. The method 200 continues with block 224 in which the metal layers outside the first and second trenches are removed. The discussion that follows with reference to FIGS. 3-12 describes various embodiments of a semiconductor device that can be fabricated according to the method 200 of FIG. 2.

Referring to FIGS. 3-12, illustrated are cross sectional views of a semiconductor device 300 at various stages of fabrication according to the method 200 of FIG. 2. The semiconductor device 300 includes an NMOS FinFET device 302 and PMOS FinFET device 304. It should be noted that part of the semiconductor device 300 may be fabricated with CMOS technology process flow. Accordingly, it is understood that additional processes may be provided before, during, and after the method 200 of FIG. 2, and that some other processes may only be briefly described herein. It should also be noted that only a portion of the NMOS device 302 and PMOS device 304 is shown for the sake of clarity to better understand the inventive concepts of the present disclosure. The semiconductor device 300 may be fabricated in a gate last process (also referred to as a gate replacement process). In a gate last process, a dummy poly gate structure is initially formed and followed by normal CMOS process flow until deposition of an inter-level dielectric (ILD). A chemical mechanical polishing (CMP) is performed on the ILD to expose the dummy poly gate structure. The dummy poly gate structure may then be removed and replaced with a metal gate structure.

Figure 3:
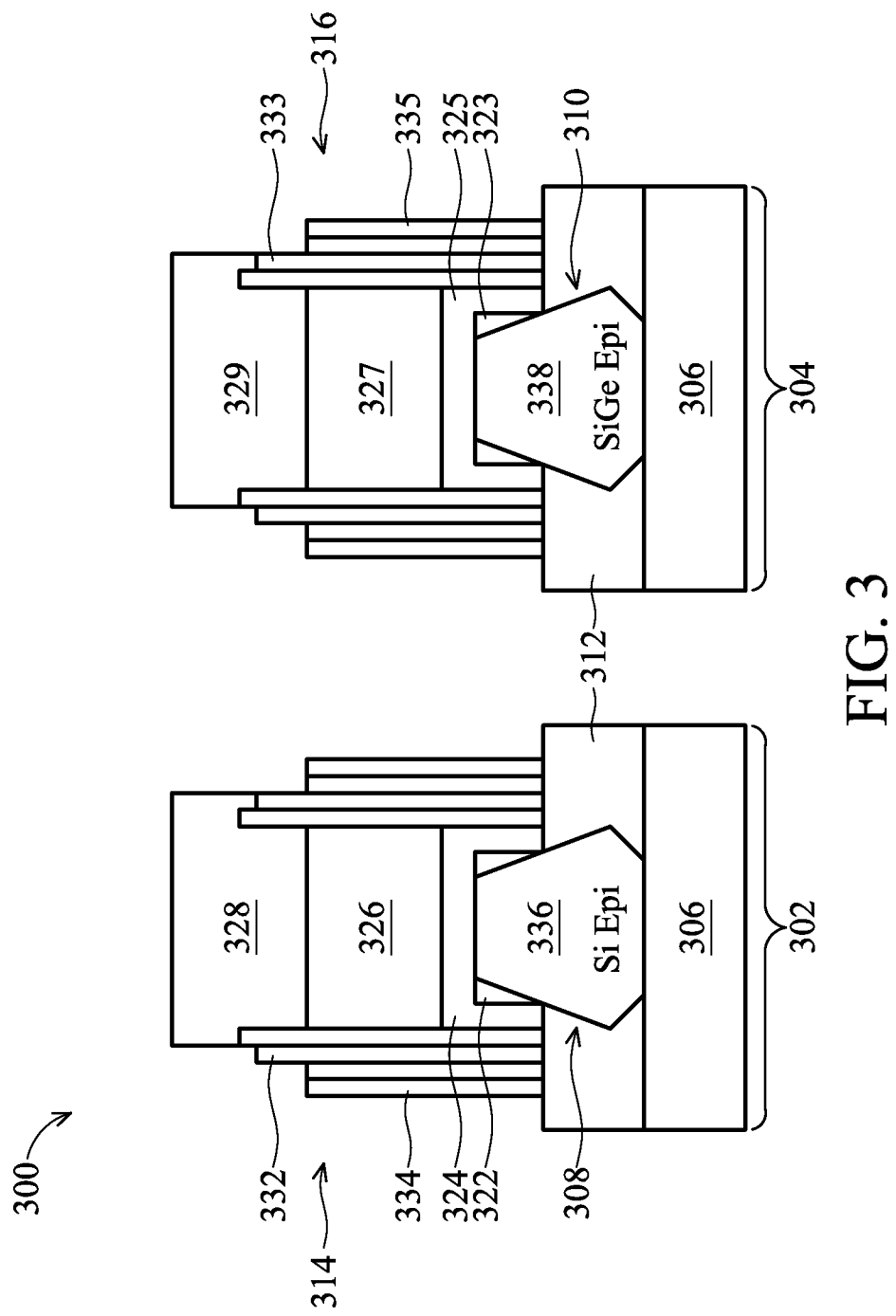
FIGS. 3-12 are cross-sectional views of a semiconductor device with n-type and p-type FinFET devices at various stages of fabrication according to the method of FIG. 2.

In FIG. 3, the semiconductor device 300 is shown following an epitaxial process that forms an epi Si for source and drain regions of the NMOS device 302, and an epitaxial process that forms an epi SiGe for source and drain regions of the PMOS device 304. The semiconductor device 300 includes a substrate 306 such as a bulk silicon substrate in a crystalline structure. In other embodiments, the substrate 306 may include other elementary semiconductors such as germanium, or include a compound semiconductor such as, silicon carbide, gallium arsenide, indium arsenide, and indium phosphide. In some other embodiments, the substrate 306 includes a silicon-on-insulator (SOI) substrate. The SOI substrate may be fabricated using separation by implantation of oxygen (SIMOX), wafer bonding, and/or other suitable methods.

Fin structures 308 are formed for the NMOS device 302 and fin structures 310 are formed for the PMOS device 304. Although only one fin structure is illustrated in each of the NMOS device 302 and PMOS device 304, it is understood that multiple fins may be formed in each device as was illustrated in FIG. 1. The fin structures 308, 310 may be fabricated using suitable processes including photolithography and etch processes. The photolithography process may include forming a photoresist layer (resist) overlying the substrate 306, exposing the resist to a pattern, performing post-exposure bake processes, and developing the resist to form a masking element including the resist. The masking element may then be used to etch the fin structures 308, 310 into the substrate 306. The fin structures 308, 310 may be etched using reactive ion etch (RIE) and/or other suitable processes. The fin structures 308, 310 may have a width ranging from about 20 to about 30 nm. A dielectric may be deposited and etched form shallow trench isolation (STI) structures 312 surround the fin structures 308, 310.

In an embodiment, the fin structures may be formed by double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

Gate structures 314, 316 formed over a central portion of the fin structures 308, 310, respectively. The gate structures 314, 316 each includes a gate dielectric layer 322, 323 respectively. In an embodiment, the gate dielectric layer 322, 323 may include an interfacial layer. The interfacial layer may include a silicon oxide layer (e.g., thermal or chemical oxide formation) having a thickness ranging from about 5 to about 10 angstrom (A). Alternatively, the interfacial layer may include HfSiO or SiON formed by atomic layer deposition (ALD), chemical vapor deposition (CVD), physical vapor deposition (PVD), thermal oxidation, or combinations thereof. The gate dielectric layer 322, 323 may further include a high-k dielectric layer formed on the interfacial layer. The high-k dielectric layer may be formed by atomic layer deposition (ALD) or other suitable technique. The high-k dielectric layer may include a thickness ranging from about 1 to about 200 angstrom (Å). The high-k dielectric layer may include hafnium oxide (HfOx). Alternatively, the high-k dielectric layer may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The gate structures 314, 316 may further include a cap layer 324, 325 formed over the gate dielectric layer 322, 323, respectively. The cap layer 324, 325 includes TiN having a thickness ranging from about 5 to about 1000 angstrom (Å). Alternatively, the capping layer may include TaN. The cap layer 324, 325 may function as a barrier between the high-k dielectric layer and a subsequent dummy poly gate structure to reduce or eliminate the risk of Fermi level pinning between the poly and the high-k dielectric during processing. The cap layer may be formed by various deposition techniques such as ALD, PVD, CVD, or other suitable technique.

The gate structures 314, 316 further include a polysilicon (or poly) layer 326, 327 formed over the cap layer 324, 325, respectively, by a suitable deposition process. For example, silane (SiH4), di-silane (Si2H6), or di-clorsilane (SiCl2H4) may be used as a chemical gas in a CVD process to form the poly layer 326, 327. The poly layer 326, 327 may be referred to as a dummy poly layer since it will be replaced with a metal gate electrode as will be discussed below. The poly layer 326, 327 may include a thickness ranging from about 200 to about 2000 angstrom (Å). Alternatively, an amorphous silicon layer may optionally be formed instead of the polysilicon layer.

The gate structures 314, 316 may further include a hard mask layer 328, 329 formed on the poly layer 326, 327, respectively. The hard mask layer 328, 329 may include silicon oxide, silicon nitride, silicon oxynitride, silicon carbide, and/or other suitable dielectric materials, and may be formed using a method such as CVD or PVD. The hard mask layer 328, 329 may include a thickness ranging from about 100 to about 4000 angstrom (Å). Additionally, an antireflective coating layer or bottom antireflective coating (BARC) layer may be used to enhance a photolithography process for patterning a photoresist layer.

One exemplary method for patterning the various layers to form the gate structures 314, 316 is disclosed. After depositing the poly layer, a CMP is performed on the poly layer to planarize the poly. A hard mask layer is deposited on the planarized poly layer. A layer of photoresist is formed on the hard mask layer by a suitable process, such as spin-on coating, and then patterned to form a patterned photoresist feature by a proper lithography patterning method. The patterned photoresist layer is formed on the hard mask layer. The pattern of the photoresist layer is transferred to the hard mask layer and then transferred to the other layers to form the gate structures 314, 316. The STI 312 may be used as an etch stop layer when patterning the gate structures 314, 316.

The gate structures 314, 316 may further include sealing spacers 332, 333 disposed on sidewalls of the gate structures. The sealing spacers 332, 333 may be formed of silicon oxide or other suitable dielectric material. The sealing spacers 332, 333 may be formed by depositing the dielectric layer and dry etching the dielectric layer. Implantation processes may be performed to form lightly doped drain regions of an n-type (referred to as nLDD) in the NMOS device 302 and of a p-type (referred to as pLDD) in the PMOS device 304. The gate structures 314, 316 may further include dummy spacers 334, 335 disposed on the sealing spacers 332, 333, respectively. The dummy spacers 334, 335 may include a multilayer structure such as silicon nitride and silicon oxide. The dummy spacers 334, 335 may be formed by depositing the silicon nitride and silicon oxide layers, and dry etching the layers.

A process is performed to grow epitaxial (epi) silicon (Si) 336 on exposed portions of the fin structure 308 at either side of the gate structure 314. The epi Si 336 is formed without etching a recess in the fin structure 308. Additionally, a process is performed to grow epi silicon germanium (SiGe) 338 in a recess of the fin structure 310 at either side of the gate structure 316. A protection layer is formed to protect the NMOS device 302 when etching exposed portions of the fin structure 310 in the PMOS device 304. The recess is formed by a dry etching, wet etching, or combination thereof. For example, a dry etching removes portions of the fin structure 310 that are unprotected or exposed. In some embodiments, a pre-cleaning process may be performed to clean the recess with HF or other suitable solution. The epi Si 336 may be doped with n-type dopants, such as phosphorous or arsenic, to form source and drain regions (S/D regions) of the NMOS device 302. In other embodiments, epi SiC may be used instead of the ep Si in the NMOS device 302. The epi SiGe 338 may be doped with p-type dopants, such as boron, to form source and drain regions (S/D regions) of the PMOS device 304. In some embodiments, main sidewall spacers may be formed in place of the dummy spacers 334, 335 prior to implanting the n-type and p-type dopants.

Figure 4:
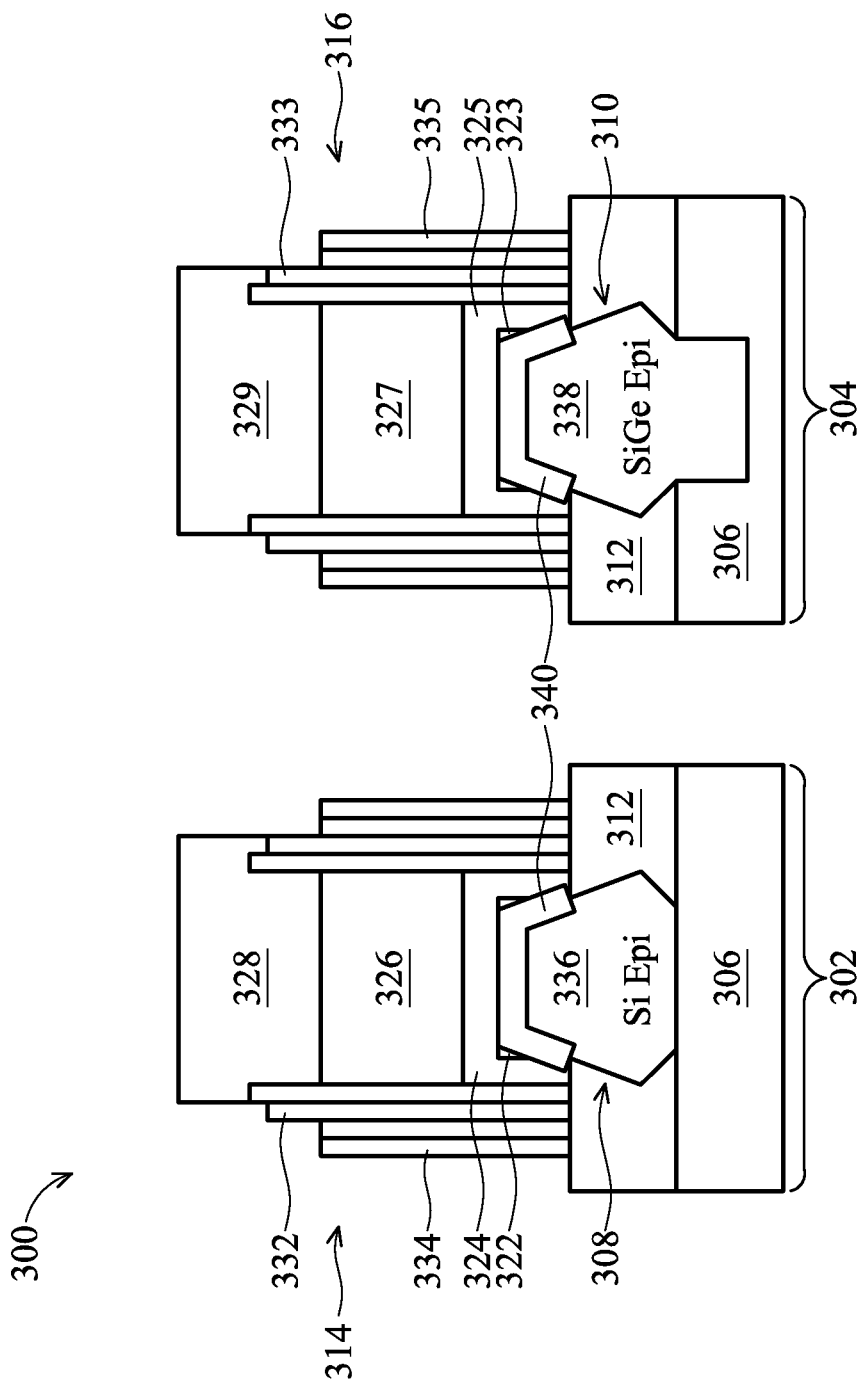

In FIG. 4, the semiconductor device 300 further includes silicide features 340 disposed on source/drain regions (S/D regions) of the epi Si 336 in the NMOS device 302 and on source/drain regions (S/D regions) of the epi SiGe 338 in the PMOS device 304. In some embodiments, silicide features 340 may be formed by silicidation such as self-aligned silicide (salicide) in which a metal material is formed over the substrate including next to the epi Si 336 and ep SiGe 338, then the temperature is raised to anneal and cause reaction between underlying silicon and the metal to form silicide, and un-reacted metal is etched away. The salicide features 340 may be self-aligned to be formed on the source and drain regions of the NMOS 302 and PMOS 304 devices to reduce contact resistance. It is noted that the hard mask layer 328, 329 prevents silicidation of the underlying poly layer 326, 327 in the gate structures 314, 316, respectively.

Figure 5:
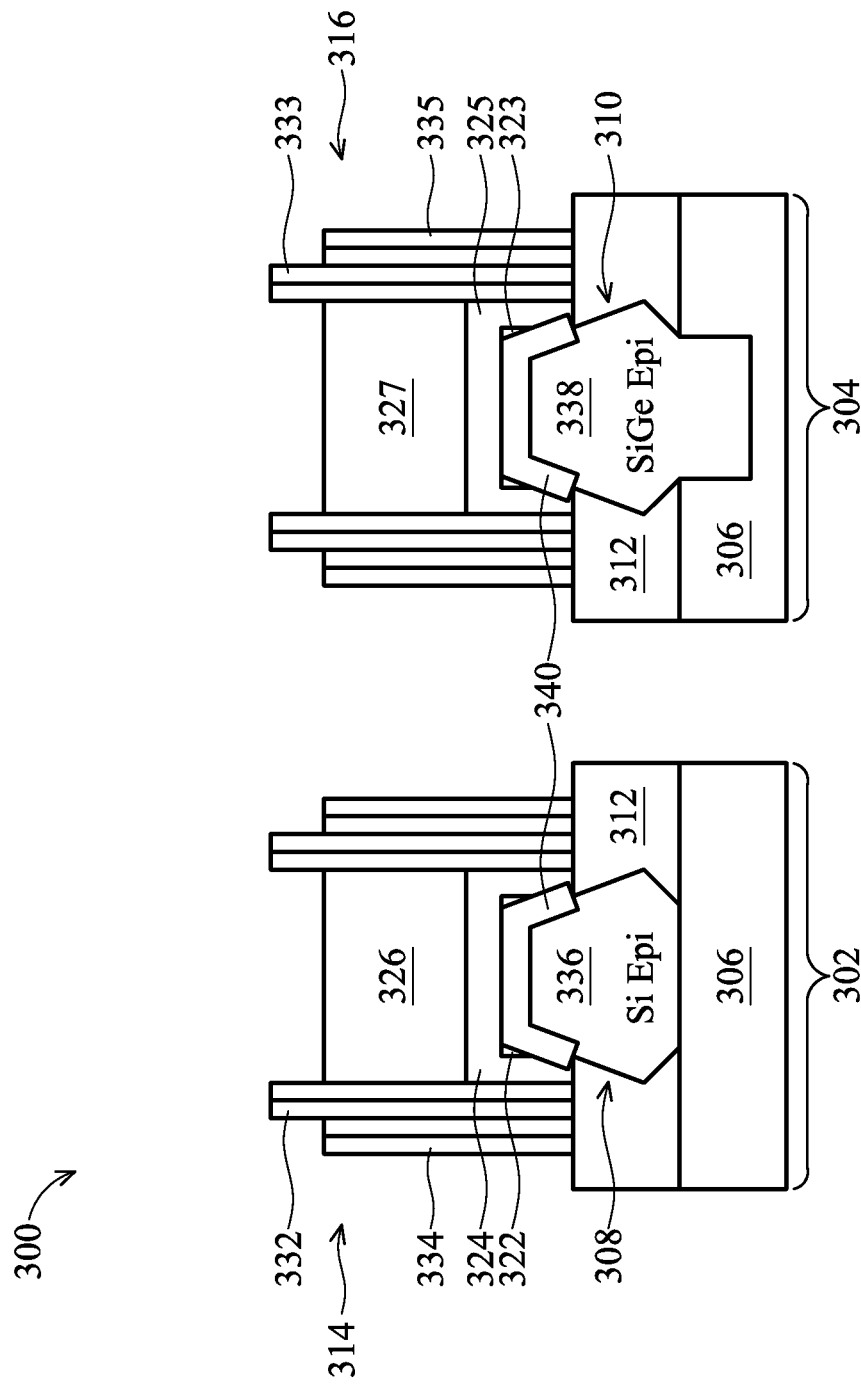

In FIG. 5, following the silicidation process, the hard mask layer 328, 329 is removed from the gate structures 314, 316 by an etching process. The etching process may include a dry etching, wet etching, or combination thereof.

Figure 6:
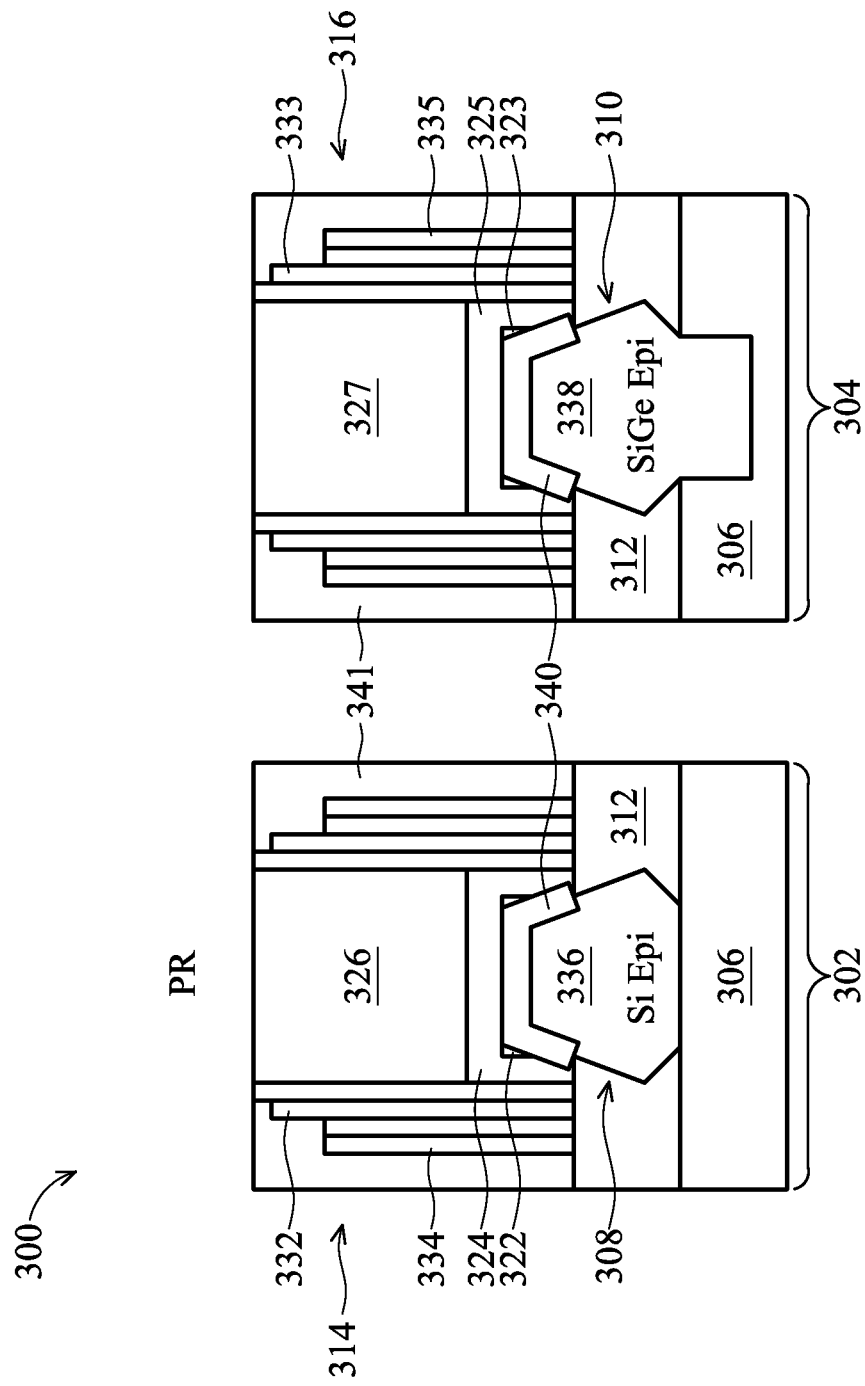

In FIG. 6, a contact etch stop layer (not shown) may be formed over the substrate 306 including over the gate structures 314, 316, silicide features 340, and STI 312. Additionally, an inter-level dielectric (ILD) 341 is formed over the substrate 306. The ILD 341 may include a oxide formed by a high aspect ratio process (HARP) and/or high density plasma (HDP) deposition process. Thereafter, a CMP process may be performed on the ILD 341 to planarize and polish the ILD until the poly layers 326, 327 are exposed in the gate structures 314, 316 respectively.

Figure 7:
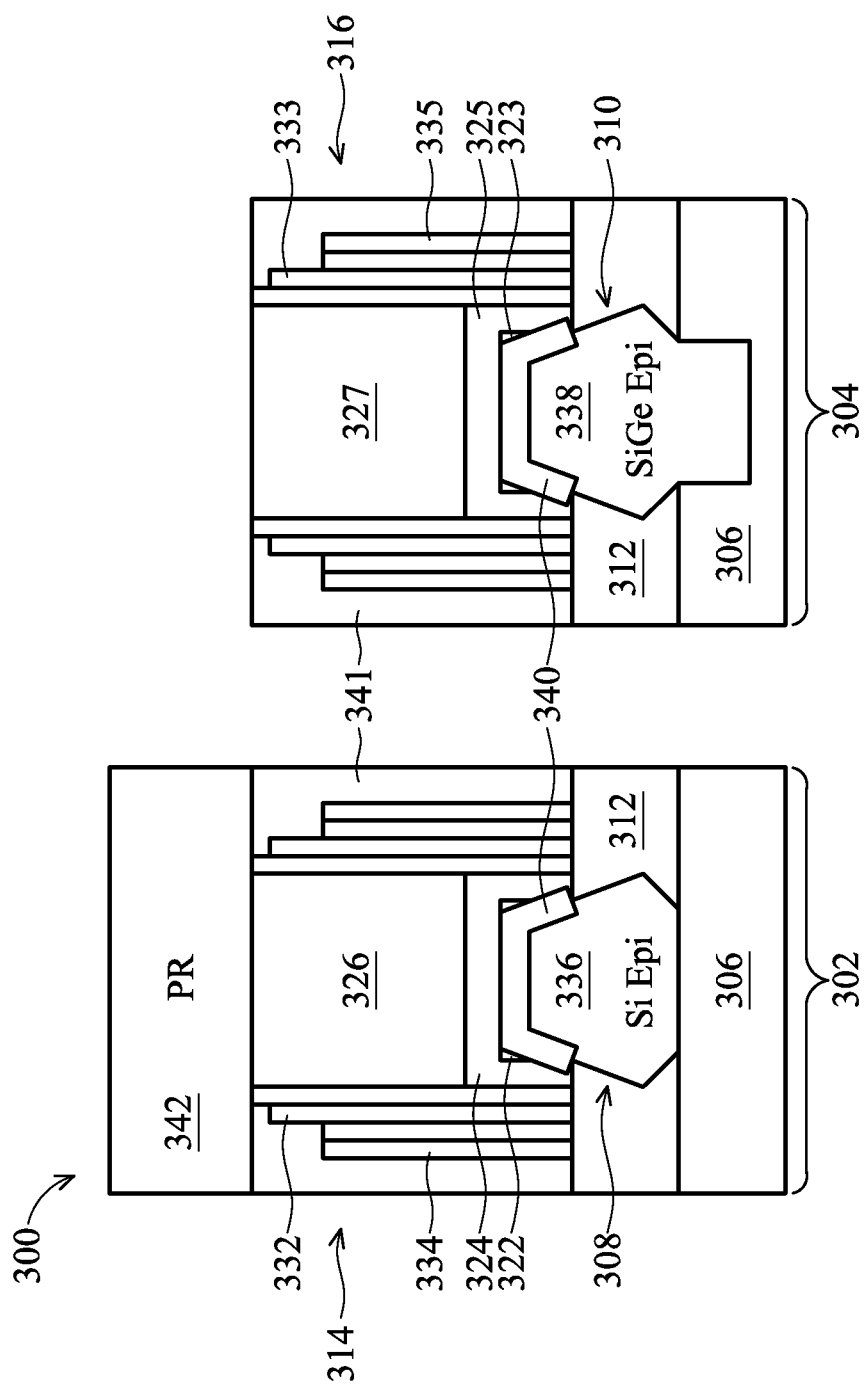

In FIG. 7, a patterned photoresist layer 342 is formed to protect the NMOS device 302 region. For example, a photolithography process may include forming a photoresist layer (resist) overlying the substrate, exposing the resist to a pattern, performing post-exposure bake processes, and developing the resist to form the patterned resist layer 342.

Figure 8:
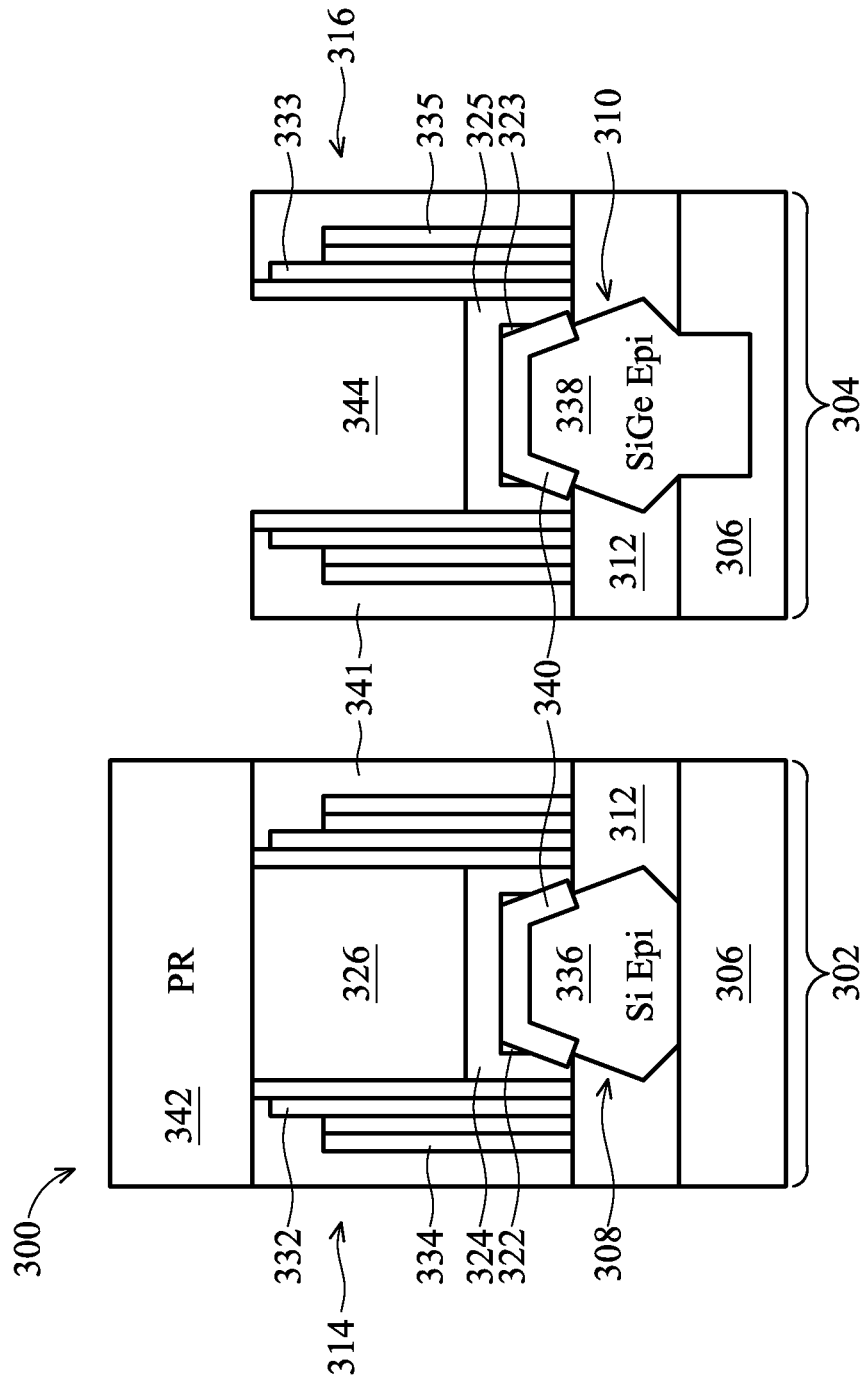

In FIG. 8, the poly layer 327 is removed from the gate structure 316 thereby forming a trench 344. The poly layer 327 may be removed by a wet or dry etch process. For example, a wet etch process may include exposure to a hydroxide containing solution (e.g., ammonium hydroxide), deionized water, and/or other suitable etchant solutions. The cap layer 325 may function as an etch stop layer for the etching.

Figure 9:
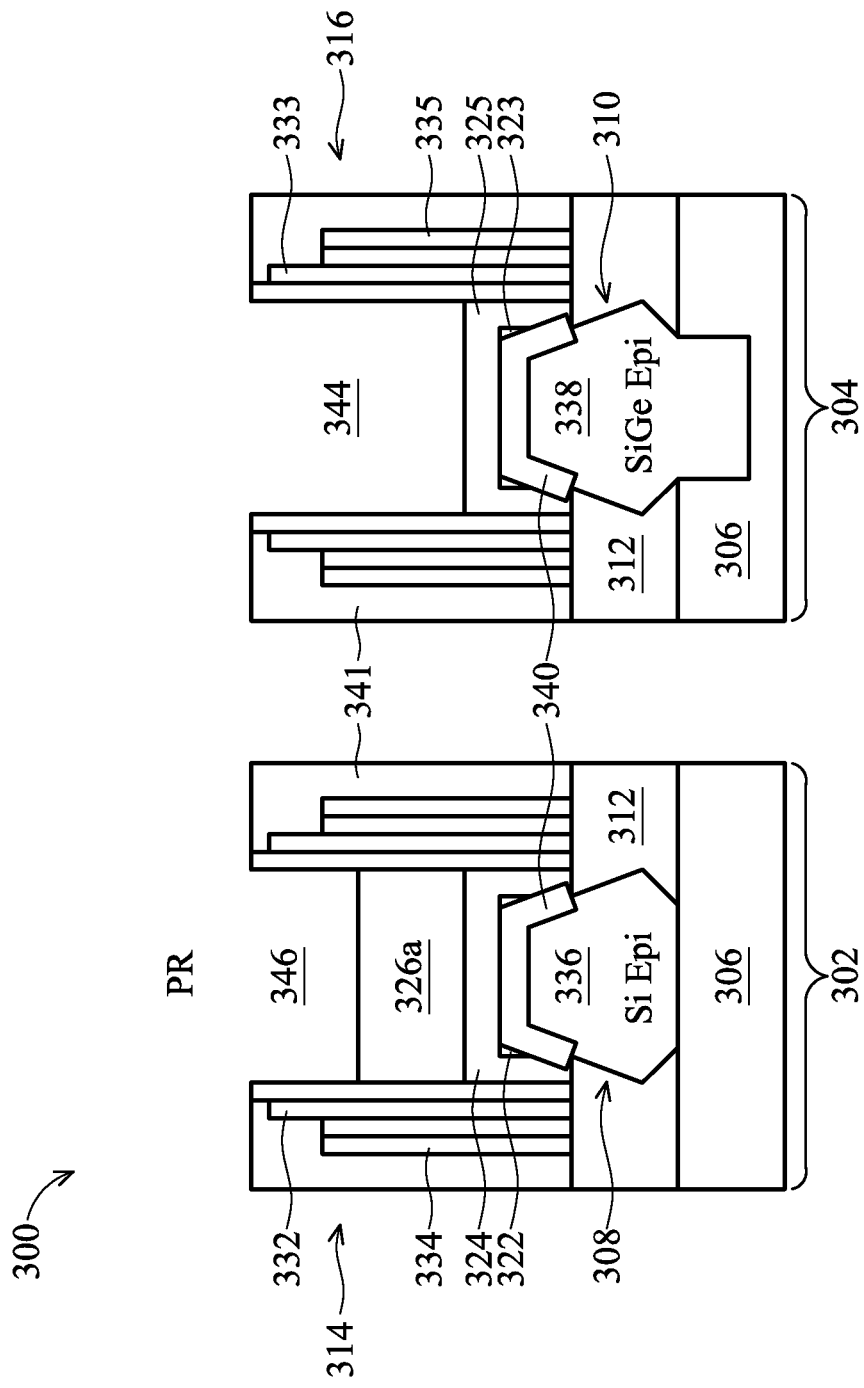

In FIG. 9, the patterned resist layer 342 is removed by a stripping or other suitable technique. The poly layer 326 is partially removed from the gate structure 314 thereby forming a trench 346. The poly layer 326 may be partially removed by a wet or dry etch process. A remaining poly layer 326a in the gate structure 314 may have a thickness ranging from about 1 nm to about 100 nm. It is noted that the remaining poly layer 326a was doped during deposition of the poly layer prior to etching the gate structures 314, 316. Accordingly, the remaining poly layer 326a is a conductive layer of the gate electrode of the NMOS device 302. Thus, the present process may be considered as a hybrid gate last process since a portion of the gate electrode is formed in a gate first process and another portion of the gate electrode is formed in a gate last process as will be discussed below.

Figure 10:
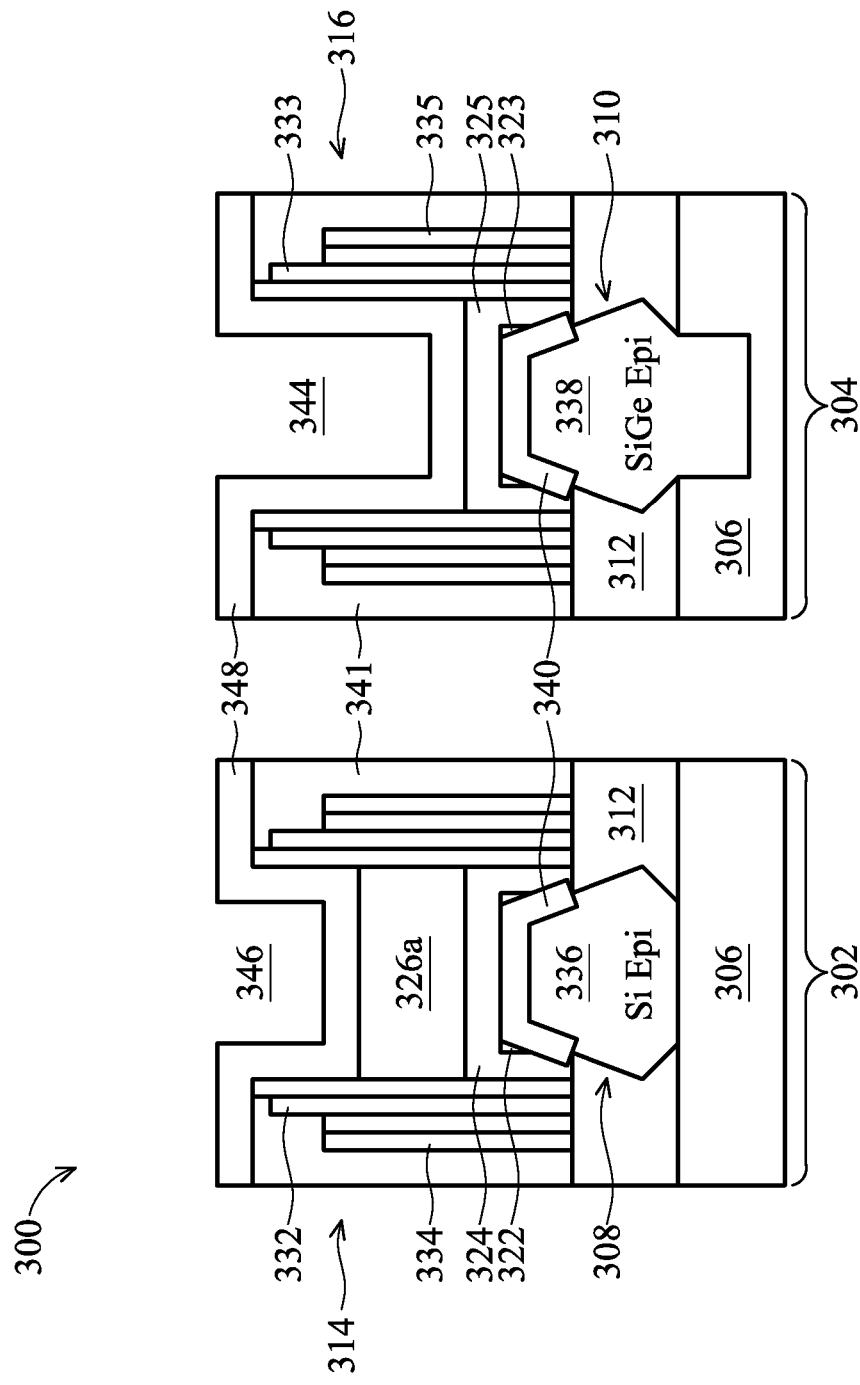

In FIG. 10, a work function metal layer 348 is formed over the substrate 306 partially filling the trenches 344, 346. In an embodiment, the work function metal layer 348 includes a p-type work function metal (P-metal) layer may be formed in a portion of the trenches 344, 346. The P-metal layer may be formed by ALD, PVD, CVD, or other suitable process. Further, the P-metal layer may include a single metal layer or multi-metal layer structure with a sufficiently high effective work function (EWF) value for properly performing in the PMOS device 304. The P-metal layer may include a TiN layer having a thickness ranging from about 40 nm to about 60 nm, and a TaN layer having a thickness ranging from about 15 nm to about 25 nm. Alternatively, the P-metal layer may include other materials such as Ru, Mo, Al, WN, and combinations thereof. It is noted that the P-metal layer overlying the remaining poly layer 326a in the gate structure 314 does not adversely effect the performance in the NMOS device 302.

Figure 11:
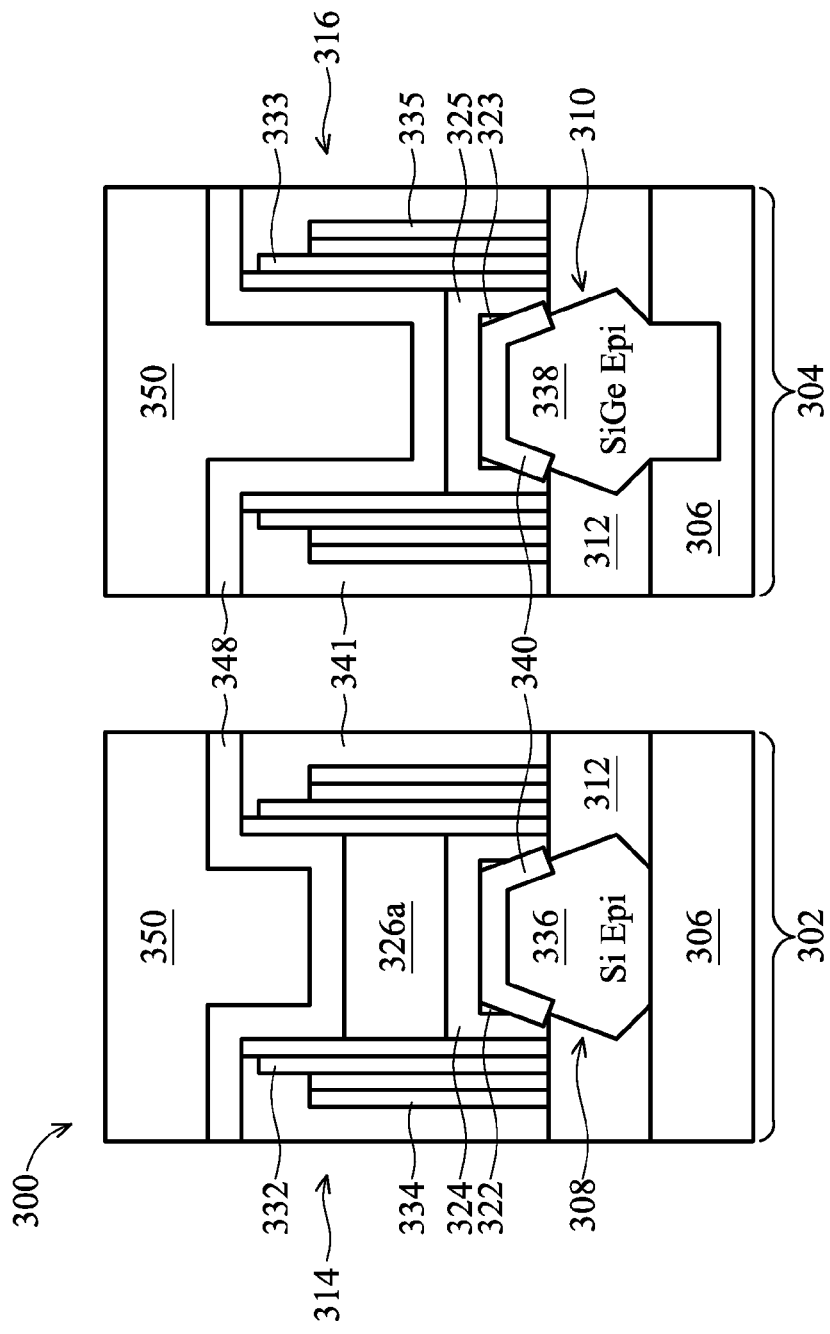

In FIG. 11, a fill metal layer 350 is formed over the substrate 306 filling in remaining portions of the trenches 344, 346. In an embodiment, the fill metal layer 350 includes aluminum (Al). A Ti layer may be formed to serve as a wetting layer. The Ti layer may be formed by PVD or other suitable technique. An Al layer may be formed over the Ti layer filling the remainder of the trenches 344, 346. The Al layer may be formed by CVD, PVD, or other suitable technique. Alternatively, the fill metal layer may include copper (Cu) and tungsten (W).

Figure 12:
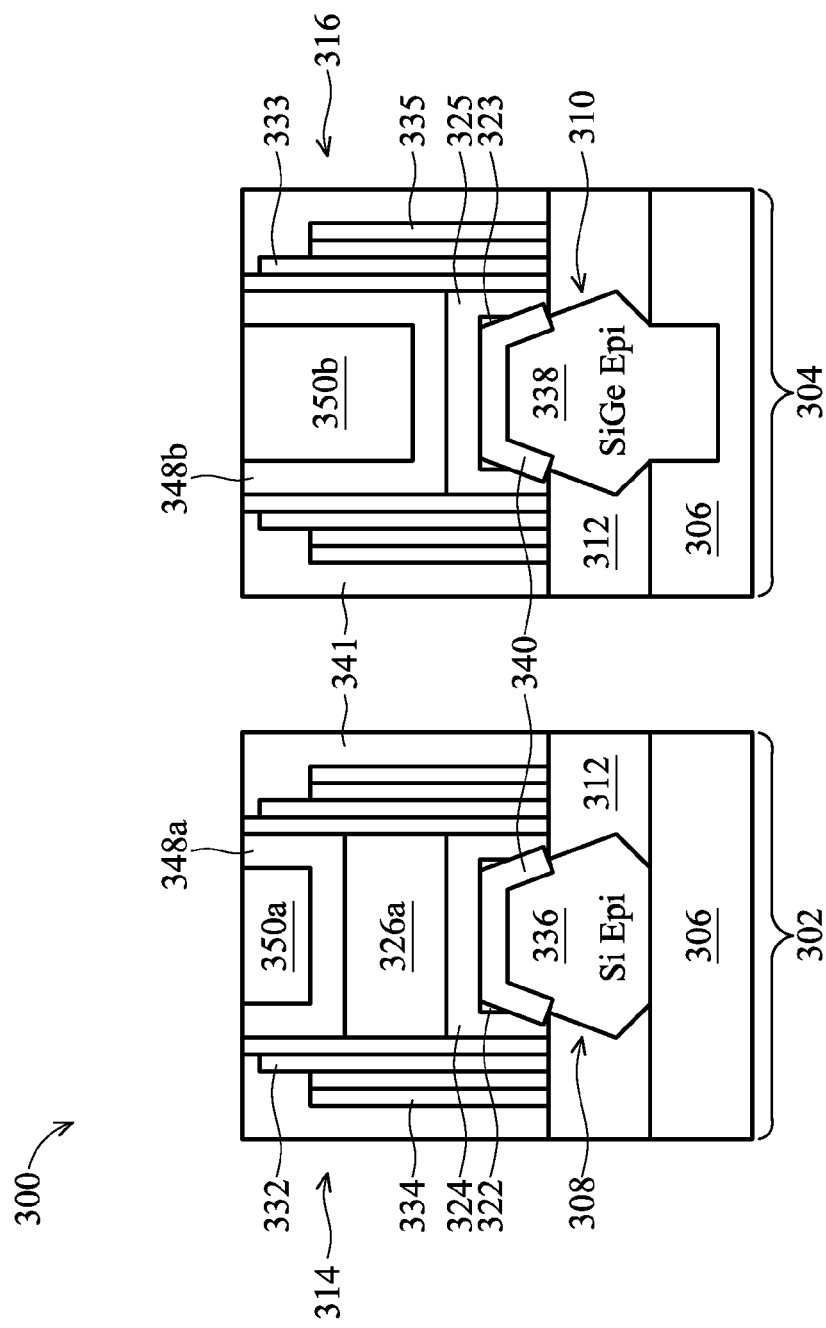

In FIG. 12, a CMP is performed to planarize the semiconductor device 300 and remove the metal layers outside of the trenches 344, 346. Following the CMP, portions of the work function metal layer 348a, 348b and fill metal layer 350a, 350b remain in the trenches 344, 346, respectively. Accordingly, metal gates are formed in the gate structures 314, 316 of the NMOS 302 and PMOS 304 devices, respectively. It is understood that the semiconductor device 300 may undergo further processing to complete fabrication. For example, a multilayer interconnection (MLI) including metal layers (e.g., M1, M2, etc.) and inter-metal dielectric (IMD) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

Figure 13:
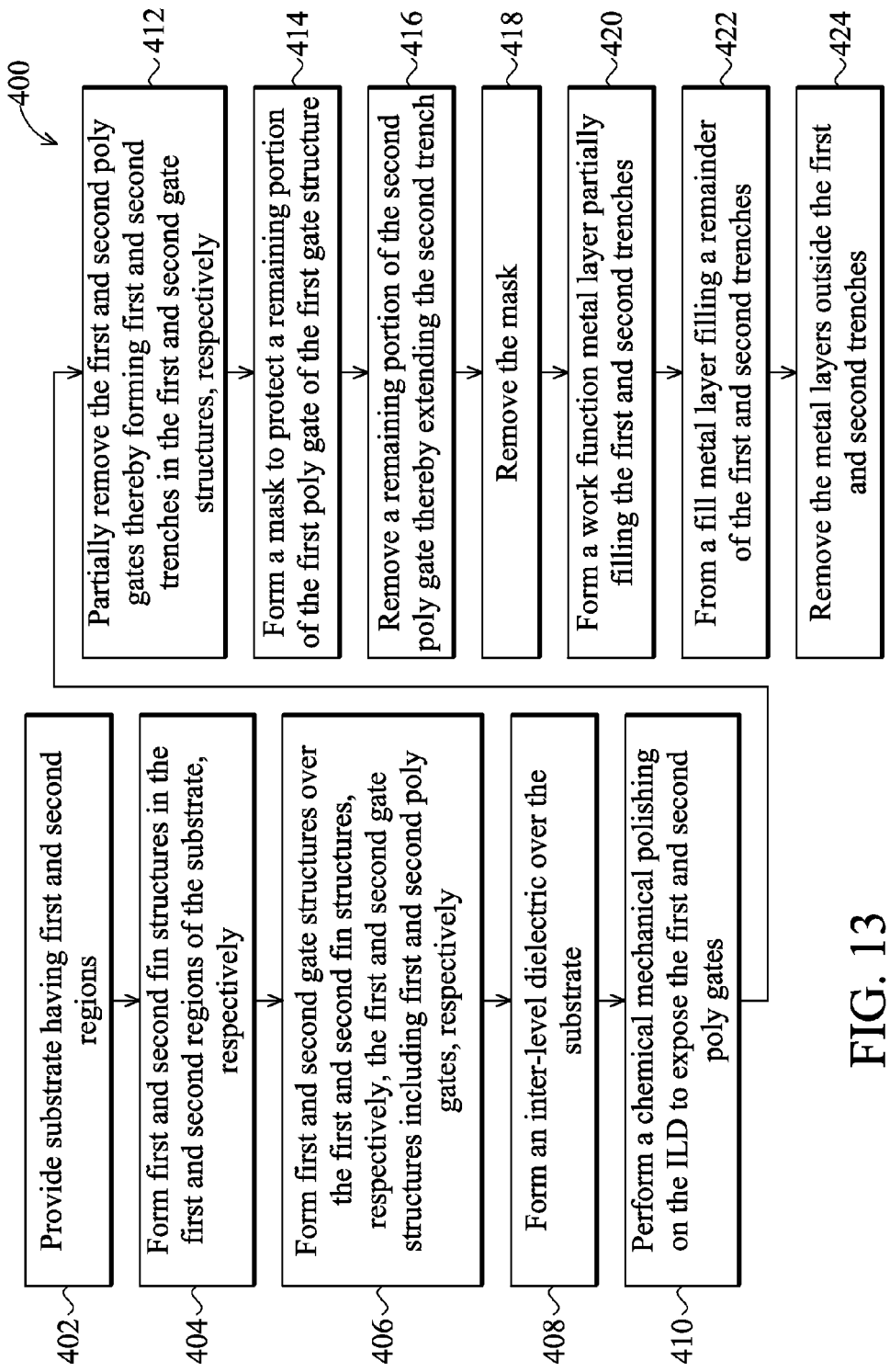
FIG. 13 is a flowchart of another method of fabricating a semiconductor device.

Referring to FIG. 13, illustrated is another embodiment of a method 400 of fabricating a semiconductor device according to various aspects of the present disclosure. The method 400 begins with block 402 in which a substrate having first and second regions is provided. The method 400 continues with block 404 in which first and second fin structures are formed in the first and second regions of the substrate, respectively. The method 400 continues with block 406 in which first and second gate structures are formed over the first and second fin structures, respectively. The first and second gate structures include first and second polysilicon (poly) gates, respectively. The method 400 continues with block 408 in which an inter-level dielectric (ILD) is formed over the substrate. The method 400 continues with block 410 in which a chemical mechanical polishing (CMP) is performed on the ILD to expose the first and second poly gates. The method 400 continues with block 412 in which the first and second poly gates are partially removed thereby forming first and second trenches in the first and second gate structures, respectively.

The method 400 continues with block 414 in which a mask is formed to protect a remaining portion of the first poly gate of the first gate structure. The method 400 continues with block 416 in which a remaining portion of the second poly gate is removed thereby extending the second trench. The method 400 continues with block 418 in which the mask is removed. The method 400 continues with block 420 in which a work function metal layer is formed partially filling the first and second trenches. The method 400 continues with block 422 in which a fill metal layer is formed filling a remainder of the first and second trenches. The method 400 continues with block 424 in which the metal layers outside the first and second trenches are removed. The discussion that follows with reference to FIGS. 14-18 describes various embodiments of a semiconductor device that can be fabricated according to the method 400 of FIG. 13.

Figure 14:
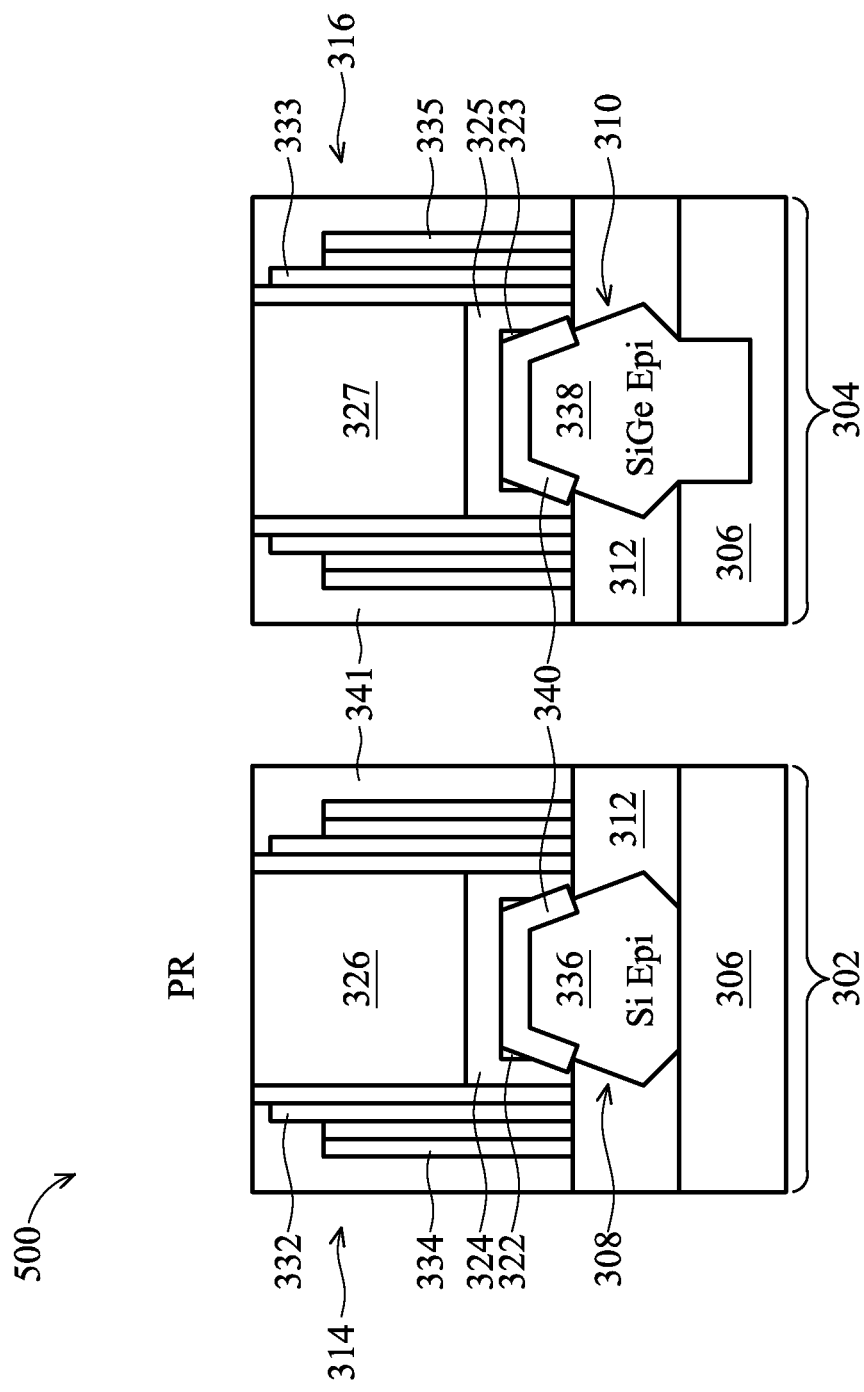
FIGS. 14-18 are cross-sectional views of a semiconductor device with n-type and p-type FinFET devices at various stages of fabrication according to the method of FIG. 13.

Referring to FIGS. 14-18, illustrated are cross sectional views of a semiconductor device 500 at various stages of fabrication according to the method 400 of FIG. 13. The semiconductor device 500 is similar to the semiconductor device 300 except for the differences discussed below. Accordingly, similar features in FIGS. 3-12 and 14-18 are numbered the same for the sake of simplicity and clarity. It should be noted that part of the semiconductor device 500 may be fabricated with a CMOS process flow. Accordingly, it is understood that additional processes may be provided before, during, and after the method 400 of FIG. 13, and that some other processes may only be briefly described herein. The semiconductor device 500 may undergo the same processing that was disclosed with reference to FIGS. 3-6 for semiconductor device 300. FIG. 14 illustrates the semiconductor device 500 at the same stage of fabrication as illustrated in FIG. 6 for the semiconductor device 300. The poly layers 326, 327 are exposed following the CMP on the ILD 341.

Figure 15:
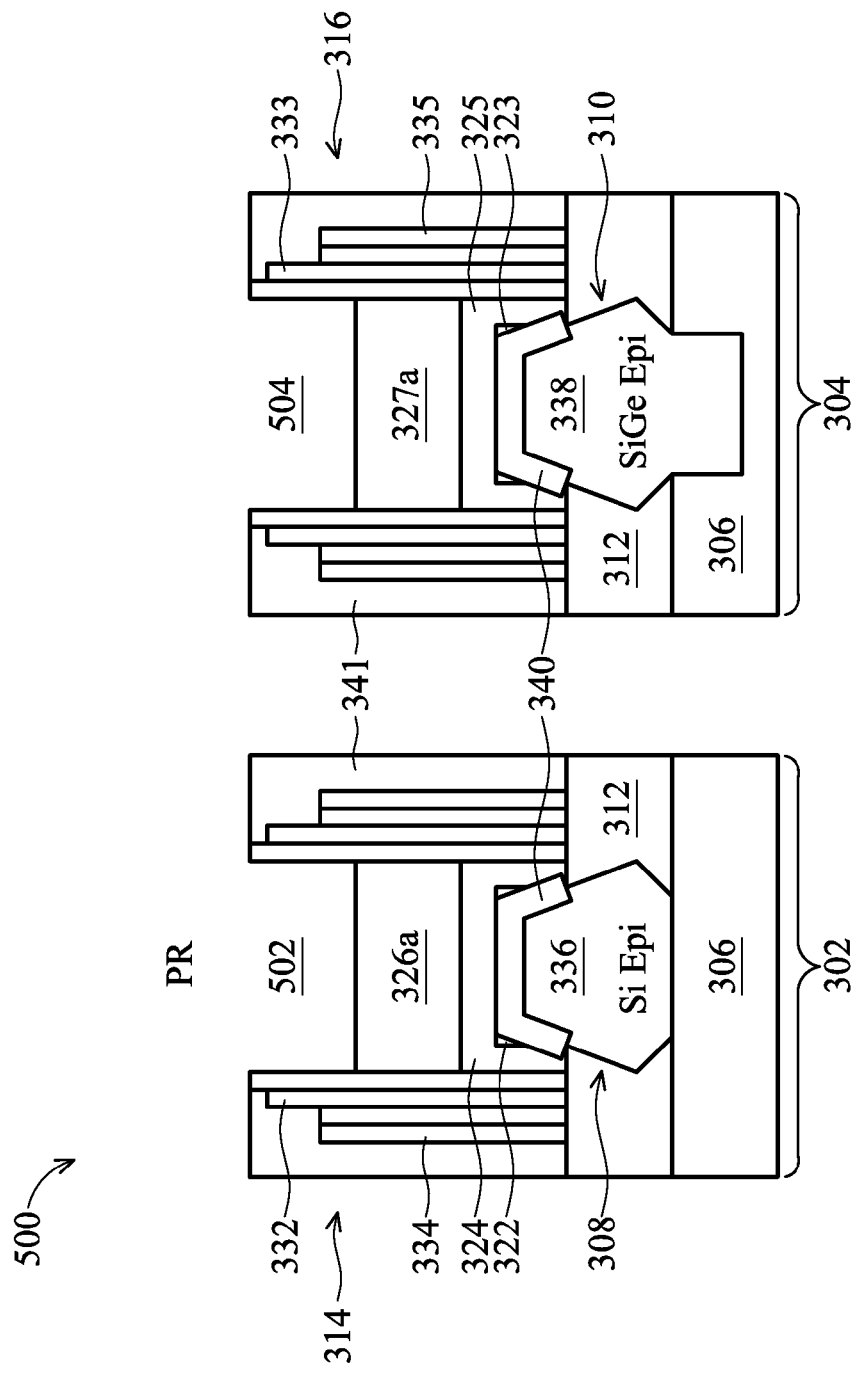

In FIG. 15, the poly layers 326, 327 are partially removed from the gate structures 314, 316, respectively, thereby forming trenches 502, 504. The poly layers 326, 327 are partially removed from the gate structures 314, 316 thereby forming trenches 502, 504. The poly layers 326, 327 may be partially removed by a wet or dry etch process. For example, a wet etch process may include exposure to a hydroxide containing solution (e.g., ammonium hydroxide), deionized water, and/or other suitable etchant solutions. A remaining poly layer 326a, 327a in the gate structures 314, 316 may have a thickness ranging from about 5 nm to about 50 nm.

Figure 16:
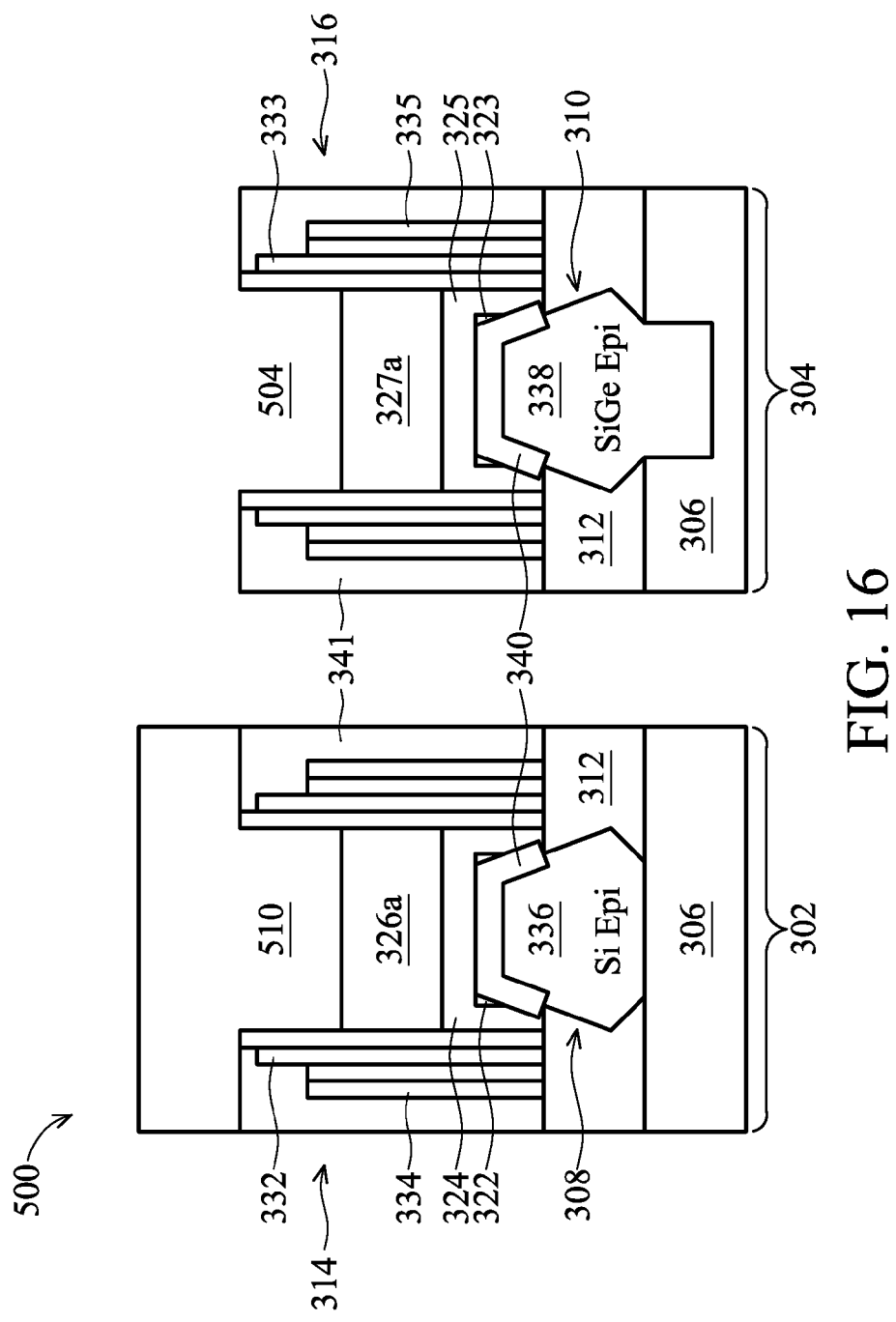

In FIG. 16, a patterned photoresist layer 510 is formed to protect the NMOS device 302 region. For example, a photolithography process may include forming a photoresist layer (resist) overlying the substrate, exposing the resist to a pattern, performing post-exposure bake processes, and developing the resist to form the patterned resist layer 510.

Figure 17:
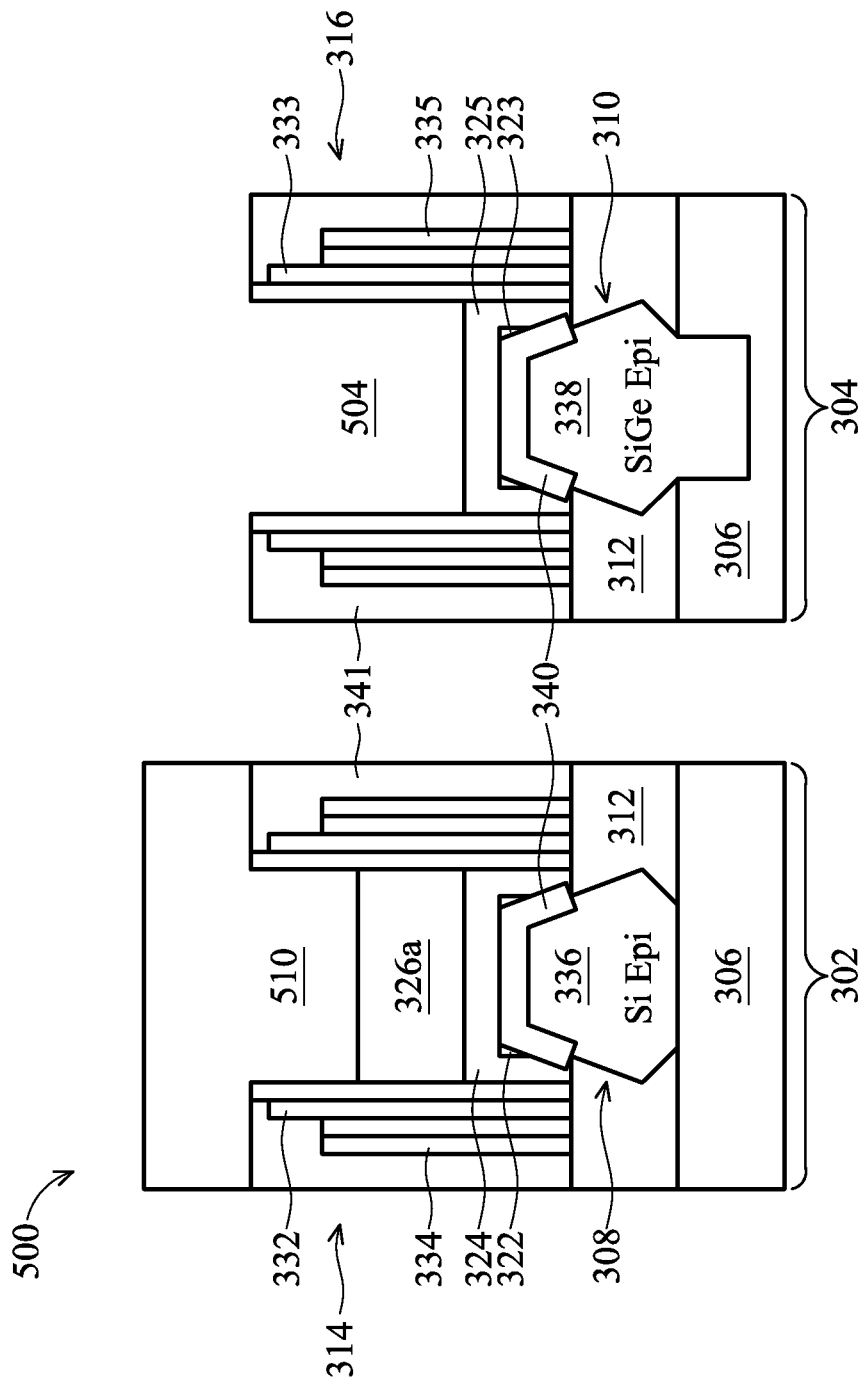

In FIG. 17, the remaining poly layer 327a is removed from the gate structure 316 thereby extending the trench 504. The cap layer 325 may function as an etch stop layer for the etching. It is noted that the remaining poly layer 326a in the gate structure 314 was doped during deposition of the poly layer prior to etching the gate structures 314, 316. Accordingly, the remaining poly layer 326a is a conductive layer of the gate electrode of the NMOS device 302. Thus, the present process may be considered as a hybrid gate last process since a portion of the gate electrode is formed in a gate first process and another portion of the gate electrode is formed in a gate last process.

Figure 18:
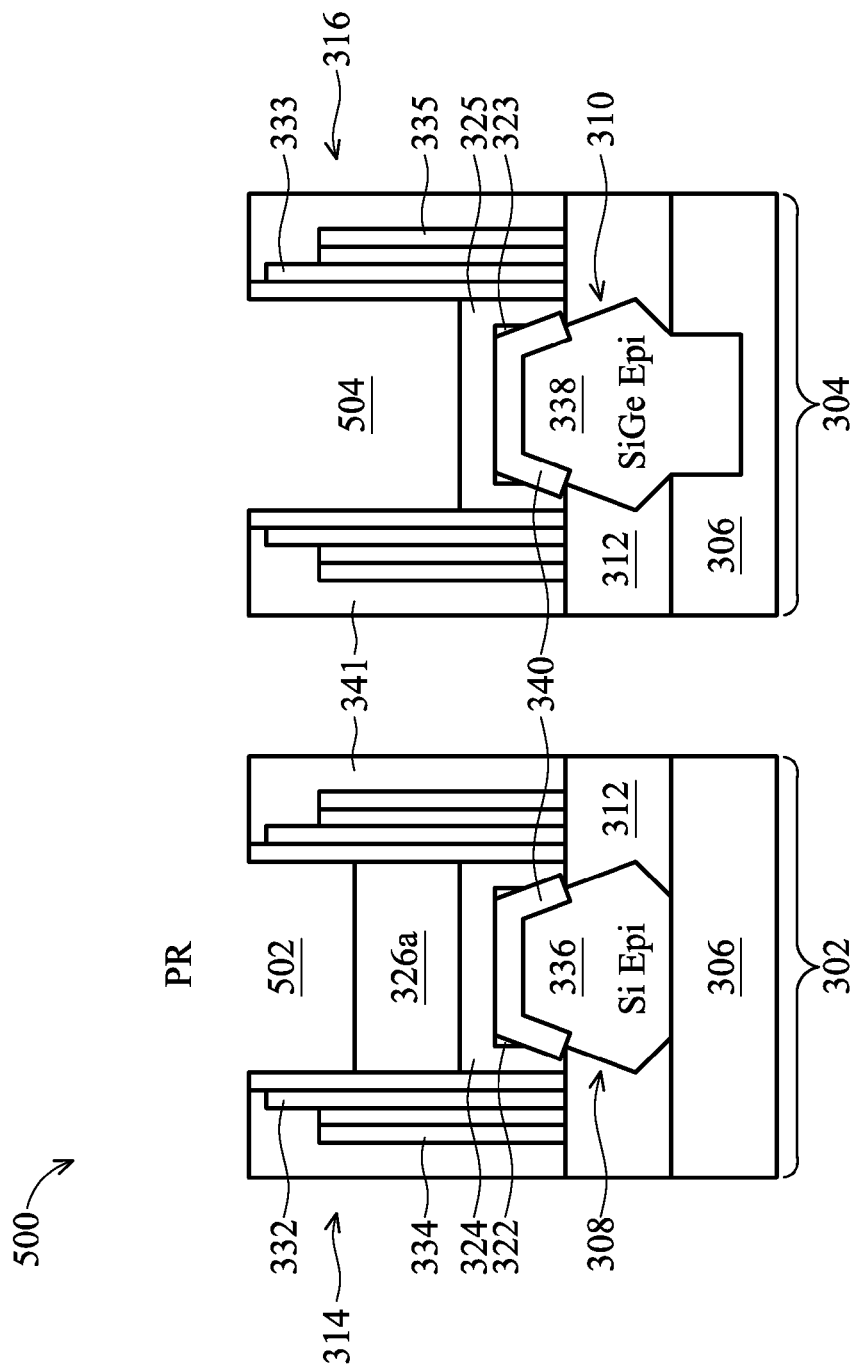

In FIG. 18, the patterned resist layer 510 is removed by a stripping or other suitable technique. The semiconductor device 500 may undergo the same processing that was disclosed with reference to FIGS. 10-12 to complete fabrication. In the embodiments disclosed herein, it is noted that replacing the poly layer with metal in FinFET devices can increase the SiGe/SiC stress upon the channel region of the PMOS/NMOS devices. The FinFET device has a higher metal gate stress sensitivity than a planar FET device due to its gate warp around configuration. The stress increases as the fin width decreases. Further, the gate last process to replace the poly layer is less complicated in the FinFET device as compared to the gate last process to replace the poly layer in a planar FET device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments have been disclosed in a gate last process (or gate replacement process), the semiconductor device may be formed in high-k dielectric last process.

What is claimed is:

1. A method of fabricating a semiconductor device, comprising:
    forming first and second fin structures in first and second regions of a substrate, respectively;
    forming first and second gate structures over the first and second fin structures, respectively, the first and second gate structures including first and second polysilicon (poly) gates, respectively;
    forming an inter-level dielectric (ILD) over the substrate;
    performing a chemical mechanical polishing (CMP) on the ILD to expose the first and second poly gates;
    forming a protection layer to protect the first poly gate of the first gate structure;
    removing the second poly gate of the second gate structure thereby forming a first trench;
    removing the protection layer;
    after removing the second poly gate of the second gate structure thereby forming the first trench, partially removing the first poly gate of the first gate structure thereby forming a second trench;

after partially removing the first poly gate of the first gate structure thereby forming the second trench, forming a work function metal layer partially filling the first and second trenches;

forming a fill metal layer filling a remainder of the first and second trenches; and removing the metal layers outside the first and second trenches.

2. The method of claim 1, wherein forming the first and second gate structures includes forming the first and second poly gates such that the first and second poly gates are doped.

3. The method of claim 1, wherein the first gate structure forms part of an n-type metal-oxide-semiconductor (NMOS) device and wherein the second gate structure forms part of a p-type MOS (PMOS) device.

4. The method of claim 3, further comprising epitaxially growing silicon (Si) on portions of the first fin structure at either side of the first gate structure.

5. The method of claim 1, wherein forming the work function metal layer includes forming a p-type work function metal layer.

6. The method of claim 1, wherein forming the first and second gate structures includes forming a high-k dielectric layer underlying each of the first and second poly gates.

7. The method of claim 1, wherein forming the work function metal layer partially filling the first and second trenches includes partially filling the first trench with the work function metal layer directly over a first capping layer and partially filling the second trench with the work function metal layer over a second capping layer.

8. A method of fabricating a semiconductor device, comprising:

forming first and second gate structures, the first and second gate structures including first and second polysilicon (poly) gates, respectively, wherein the first gate structure further includes a first capping layer formed over a first dielectric layer and the second gate structure further includes a second capping layer formed over a second dielectric layer, forming a protection layer to protect the first poly gate of the first gate structure;

removing the second poly gate of the second gate structure until exposing a portion of the second capping layer and thereby forming a first trench;

removing the protection layer;

partially removing the first poly gate of the first gate structure thereby forming a second trench;

partially filling the first and second trenches with a work function metal layer, wherein partially filling the first and second trenches with the work function metal layer includes partially filling the first trench with the work function metal layer directly on the second capping layer and partially filling the second trench with the work function metal layer over the first capping layer, and filling a remainder of the first and second trenches with a fill metal layer.

9. The method of claim 8, wherein forming the first and second gate structures includes forming the first and second poly gates such that the first and second poly gates are doped.

10. The method of claim 8, wherein the first gate structure forms part of an n-type metal-oxide-semiconductor (NMOS) device and wherein the second gate structure forms part of a p-type MOS (PMOS) device.

11. The method of claim 10, further comprising:

forming first and second fin structures prior to and adjacent with the first and second poly gate structures, respectively;

epitaxially growing silicon (Si) on portions of the first fin structure at either side of the first gate structure.

12. The method of claim 11, further comprising:

etching portions of the second fin structure at either side of the second gate structure thereby forming a recess; and epitaxially growing silicon germanium (SiGe) in the recess.

13. The method of claim 8, wherein the work function metal layer includes a p-type work function metal layer.

14. The method of claim 8, wherein the first capping layer includes at least one of TiN and TaN.

15. A method comprising:

forming first and second fin structures in first and second regions of a substrate, respectively;

forming first and second gate structures over the first and second fin structures, respectively, wherein forming the first and second gate structures includes:

forming a first capping layer over the first fin structure and forming a second capping layer over the second fin structure;

forming a first polysilicon (poly) gate electrode over the first capping layer and forming a second poly gate electrode over the second capping layer;

forming a protection layer to protect the first poly gate of the first gate structure;

removing the second poly gate of the second gate structure to expose a portion of the second capping layer and thereby forming a first trench;

after removing the second poly gate of the second gate structure, partially removing the first poly gate of the first gate structure to form a second trench;

after partially removing the first poly gate of the first gate structure to form the second trench, forming a work function metal layer over the first and second capping layers to partially fill the first and second trenches, respectively; and forming a fill metal layer filling a remainder of the first and second trenches.

16. The method of claim 15, wherein forming the first and second gate structures further includes forming a first dielectric layer over the first fin structure and forming a second dielectric layer over the second fin structure, wherein the first dielectric layer is positioned between the first fin structure and the first capping layer.

17. The method of claim 15, wherein the second capping layer includes at least one of TiN and TaN.

18. The method of claim 15, further comprising:

etching portions of the second fin structure at either side of the second gate structure thereby forming a recess; and epitaxially growing silicon germanium (SiGe) in the recess.

19. The method of claim 15, wherein the first fin structure and the second fin structure are separated from each other by a shallow trench isolation feature, wherein the first and second fin structures physically contact the shallow trench isolation feature.

20. The method of claim 15, wherein forming the first and second gate structures further includes forming a first hard mask layer over the first poly gate electrode and forming a second hard mask layer over the second poly gate electrode.

* * * * *